(12) United States Patent
Chen

(10) Patent No.: US 6,696,689 B2
(45) Date of Patent: Feb. 24, 2004

(54) METHOD AND APPARATUS FOR AVOIDING DRIVER GAS CONTAMINATION IN AN ION IMPLANTER GAS SUPPLY MODULE

(75) Inventor: Lu-Chang Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 116 days.

(21) Appl. No.: 09/927,959

(22) Filed: Aug. 10, 2001

(65) Prior Publication Data

US 2003/0030006 A1 Feb. 13, 2003

(51) Int. Cl.⁷ ............................................. G01N 21/01
(52) U.S. Cl. .............................. 250/423 R; 250/492.21
(58) Field of Search ........................... 91/4 R; 209/906; 55/282; 417/118, 126; 250/423 R, 492.21, 441.11, 379, 382; 137/501

(56) References Cited

U.S. PATENT DOCUMENTS 5,363,872 A * 11/1994 Lorimer ........................ 137/1
5,705,443 A * 1/1998 Stauf et al. .................. 438/722
6,406,519 B1 * 6/2002 Tom et al. ...................... 95/95

* cited by examiner

Primary Examiner—Stephen D. Meier
Assistant Examiner—Lam Nguyen
(74) Attorney, Agent, or Firm—Tung & Associates

(57) ABSTRACT

A gaseous supply system and method for operating the same is disclosed for supplying at least one gaseous source material to an ion source chamber for use with an ion implanter including at least one gas supply module in gaseous communication with an ion source chamber including at least one pneumatic valve to control the delivery of at least one gaseous source material to the ion source chamber for generation of source material ions for implantation including a driver gas source in communication with said at least one pneumatic valve for operating the at least one pneumatic valve said driver gas source having a different atomic mass unit than the source material ions for implantation generated from the at least one gaseous source material.

18 Claims, 1 Drawing Sheet

METHOD AND APPARATUS FOR AVOIDING DRIVER GAS CONTAMINATION IN AN ION IMPLANTER GAS SUPPLY MODULE

FIELD OF THE INVENTION

This invention generally relates ion implanters and more particularly to an apparatus and method for avoiding driver gas contamination in an ion implanter gas supply module.

BACKGROUND OF THE INVENTION

Ion beam implanters are used to implant or "dope" silicon wafers with impurities to produce n or p type doped regions on the wafers. The n and p type material regions are utilized in the production of semiconductor integrated circuits. Implanting ions generated from source materials such as antimony, arsenic or phosphorus results in n type material. If p type material is desired, ions generated with source materials such as boron, gallium or indium are typically used.

The ion beam implanter includes an ion source for generating positively charged ions from ionizable source materials. The generated ions are formed into a beam and accelerated along a predetermined beam path to an implantation station. The beam is formed and shaped by apparatus located along the beam path en route to the implantation station. When operating the implanter, the interior region must be evacuated to reduce the probability of ions being deflected from the predetermined beam path as a result of collisions with air molecules.

During ion implantation a surface is uniformly irradiated by a beam of ions or molecules, of a specific species and prescribed energy. The size of the wafer or substrate (e.g. 8 inches or greater) is typically much larger than the cross-section of the irradiating beam which deposits on the wafer as a spot or "ribbon" of about 1 inch. Commonly, in high current machines, the required uniform irradiance is achieved by moving the wafer through the beam.

Operation of an ion implanter results in the production of certain contaminant materials. These contaminant materials adhere to surfaces of the implanter beam forming and shaping structure adjacent the ion beam path and also on the surface of the wafer support facing the ion beam. Contaminant materials also include undesirable species of ions generated in the ion source, that is, ions having the either the wrong atomic mass or undesired ions of the same atomic mass.

In a conventional ion implanter, an ion beam is emitted from an ion source and passed through a pre-analyzing magnet to remove undesired types of ions. Ions having identical energies but different masses experience a different magnetic force as they pass through the magnetic field due to their differing masses thereby altering their pathways. As a result, only those desired ions of a particular atomic mass unit (AMU) are allowed to pass through a prepositioned orifice in the pre-analyzing magnet.

After passing through the pre-analyzing magnet the ion beam is accelerated to a desired energy by an accelerator. Negative ions are changed into positive ions by a charge exchange process involving collisions with a chemically inert gas such as argon. The positive ions then pass through a post-analyzing magnet and finally reach a wafer where they impact the wafer and are implanted.

Ion implantation has the ability to precisely control the number of implanted dopant atoms into substrates to within 3%. For dopant control in the $10^{14}$–$10^{18}$ atoms/cm$^3$ range, ion implantation is superior to chemical diffusion techniques. Heavy doping with an ion implanter, for example, can be used to alter the etch characteristics of materials for patterning. The implantation may be performed through materials that may already be in place while other materials may be used as masks to create specific doping profiles. Furthermore, more than one type of dopant may be implanted at the same time and at the same position on the wafer. Other advantages include the fact that ion implantation may be performed at low temperature which does not harm photoresist and in high vacuum which provides a clean environment.

With respect to impurities generated in an ion implanter, among the most troublesome are those where the product of the mass M and the energy E is the same as that of the desired species in the ion beam. In such cases, since the impurities have the same radius of curvature as the desired ion beams, they are likely to pass through both the pre-analyzing and the post-analyzing magnet and reach the wafer.

In such cases there is frequently no way to remove impurities before they reach the wafer. The passage of even a small amount of impurities can have substantial degrading effects on the electrical characteristics of the wafer. For example, in the manufacture of gate oxide films, even if only a very small amount of undesired impurities reach the wafer the quality of a gate oxide film is degraded and in subsequent processing may cause the gate oxide film to grow to an undesired thickness. As a result, semiconductor device reliability is reduced.

One particularly troublesome impurity is $N_2$ especially when carrying out an ion implantation process with silicon ions. Since Silicon and $N_2$ have the same atomic mass unit (AMU) of 28 they are not differently affected or distinguished when passing through the pre-analyzing and the post-analyzing magnet. As a result, both species are passed through to the wafer, the $N_2$ adversely affecting silicon implantation.

In an example where the presence of the impurity $N_2$ can undesirably affect the performance of an ion implanter is in the calibration of the ion implanter by the use of a metrology instrument known as a thermawave to detect ion implantation damage in the target material. Generally, a measured dose of an implanted test species (measured by monitoring a physical property change in the implanted material) is compared with a previously recorded dose to determine the calibration state of the ion implanter. Consistency between test ion implantations with low mass ions may be used to provide information about the proper operation of the ion implanter. Silicon is frequently used as a test species that is implanted, causing measurable implantation damage which is subsequently measured by a thermawave tool. Generally, the thermawave tool measures a change in the surface reflectivity of the target material which corresponds to a known dose of implanted species. Comparing a present dose to a previously recorded dose indicates whether the ion implanter is performing properly within specifications. Clearly, where the impurity $N_2$ reaches the wafer together with silicon ions in a calibration state test procedure, the calibration state will be altered resulting in faulty information concerning the operation of the ion implanter. For example, the thermawave results may erroneously indicate that the ion implanter is operating outside specifications.

One source of $N_2$ as an impurity can arise in the case where gaseous sources of implantation material are in gaseous communication with a source chamber whereby pneumatic valves are used to select and deliver the source material to the source chamber for subsequent ionization. Frequently, due to lower cost or higher availability, $N_2$ is used to drive operation of the various pneumatic valves used to deliver gaseous source materials to the source chamber. If a leak develops in the pneumatic valve, some amount of the $N_2$ may leak into the into the source material and carrier gas (e.g., Argon) pathway, thereby contaminating the source material and ultimately leading to wafer contamination in the case where silicon is used as an implanting ion.

There is therefore a need to eliminate $N_2$ contamination, especially in the case where silicon is used as an implanting ion.

It is therefore an object of the invention to eliminate the problem of $N_2$ contamination, especially in the case where silicon is used as an implanting ion.

SUMMARY OF THE INVENTION

To achieve the foregoing and other objects, and in accordance with the purposes of the present invention, as embodied and broadly described herein, the present invention provides a method and apparatus for eliminating a contamination problem presented by a driver gas.

In one embodiment according to the present invention, a gaseous supply system for supplying at least one gaseous source material to an ion source chamber for use with an ion implanter includes at least one gas supply module in gaseous communication with an ion source chamber including at least one pneumatic valve to control the delivery of at least one gaseous source material to the ion source chamber for generation of source material ions for implantation; at least one gaseous source material in communication with the gas supply module for independent delivery of said at least one gaseous source material to the source chamber; and, a driver gas source in communication with said at least one pneumatic valve for operating the at least one pneumatic valve said driver gas source having a different atomic mass unit than the source material ions for implantation generated from the at least one gaseous source material.

In related embodiments, the driver gas source includes at least one inert gas, preferably helium and argon. Further, the at least one gaseous source material includes at least one gaseous source of ions selected from the group of As, Ph, B and Si.

In another embodiment, the at least one gas supply module with the at least one pneumatic valve includes a high pressure valve in downstream communication with the at least one gaseous source material said high pressure valve in upstream communication with a means for determining a flow rate and a low pressure select valve in downstream communication with the means for determining a flow rate for selecting gaseous downstream communication with an ion source chamber. Further, the a low pressure bypass valve is in upstream gaseous communication with said high pressure valve and in gaseous downstream communication with said downstream ion source chamber to define a gaseous pathway bypassing said means for determining a flow rate and said low pressure select valve.

In yet another embodiment, a plurality of gas supply modules is in parallel gaseous communication with a downstream ion source chamber.

In another aspect of the invention, the gas supply system includes a purge line including at least one pneumatic valve in communication with said gas supply module wherein the purge line is fed with a gaseous purge source having a different atomic mass unit than the source material ions for implantation generated from the at least one gaseous source material.

In another aspect according to the present invention a method for using the apparatus of the first embodiment is presented.

These and other objects, advantages and features of the invention will become better understood from a detailed description of a preferred embodiment of the invention which is described in conjunction with the accompanying drawings.

DETAILED DESCRIPTION OF THE PREFERRED EMBODIMENTS

Figure 1:
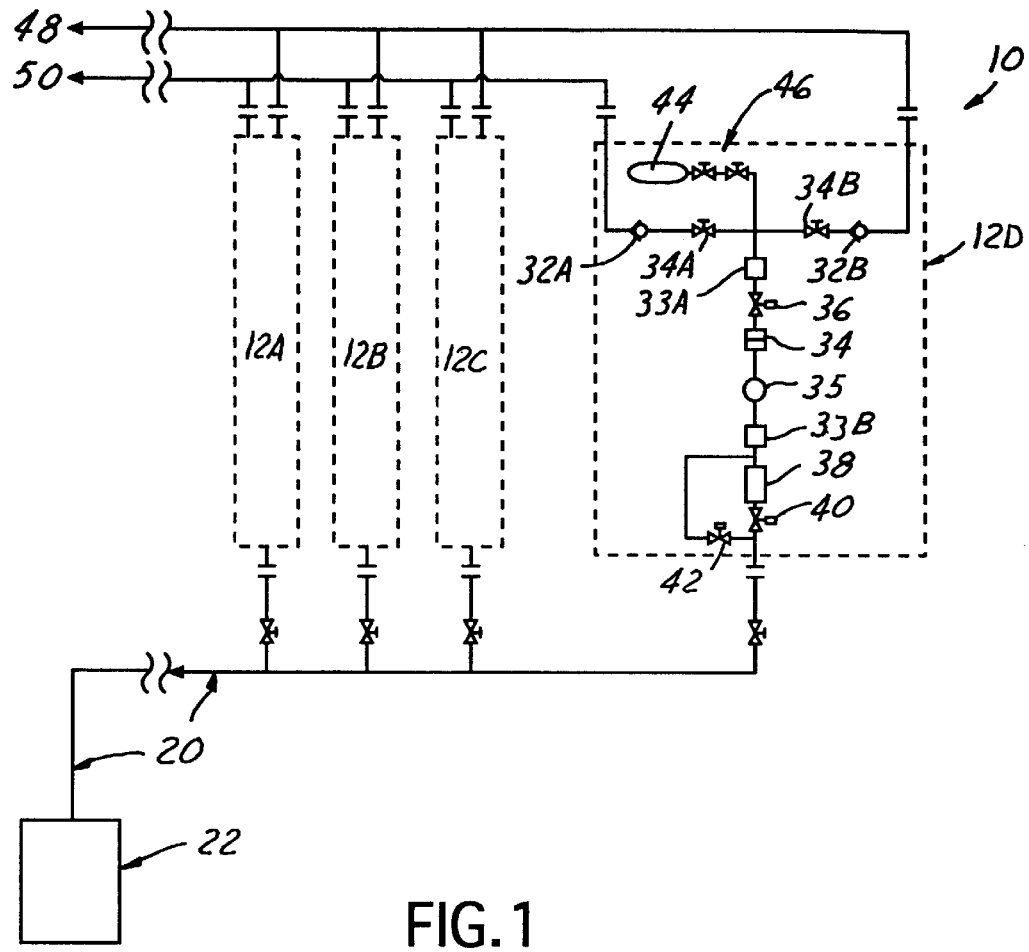
FIG. 1 is a schematic representation of a portion of the gas supply module according to the present invention.

Turning to FIG. 1, a schematic representation of one embodiment of the present invention is shown. A portion of a gaseous supply system 10 is depicted for supplying at least one gaseous source material to an ion source chamber for use with an ion implanter. As shown, a plurality of gas supply modules 12A, 12B, 12C, 12D are in parallel gaseous communication with an ion source chamber 22, for example, by gas pathway 20. An expanded schematic of a gas module is shown for gas supply module 12D. Shown in gas module 12D, for example, are pneumatic valves 36, 40 and 42 to control the delivery of at least one gaseous source material to the ion source chamber for production of a source material ion for implantation.

In operation, a gaseous source material 44 is in downstream communication with High Pressure Pneumatic Valve (HPPV) 36 after passing through high pressure transducer 33A. HPPV 36 is opened to allow the gaseous source material to pass through a gas filter 34 and a regulator 35. The gaseous source material then passes through low pressure transducer 33B to reach Mass Flow Controller 38 which controls a flow rate of gaseous source material module for independent delivery to the source chamber 22 by way of gas line 20.

In operation, a gas may be introduced into the ion source chamber at a pressure of about $10^{-3}$ Torr, which forms a plasma discharge between the plasma chamber and the filament, which is biased at about minus 100 V. Positive ions from this plasma discharge are then electrostatically extracted from the plasma and are accelerated through an aperture in the extraction electrode wall.

Gaseous source materials for generating, for example, be phosphorous and arsenic ion beams, may be phosphine ($PH_3$) and arsine ($AsH_3$), which are bottled gas feeds and are typically used because they yield the best control and give large currents of pure $^{31}P+$ and $^{75}As+$ beams, respectively. $BF_3$ is typically used to supply the ion source chamber for generating boron ions for implantation and $SiF_4$ is typically used for generating silicon ions for implantation.

In operation, Low Pressure Pneumatic Valve (LPPV) 40 is opened to selectively supply gaseous source material in the gas supply module for independent delivery to the source chamber 22 by way of gas line 20. Alternatively, the Mass Flow Controller 38 may be bypassed during purge or vent operations by opening LPPV bypass valve 42 and closing LPPV 40.

Also shown is a nitrogen feed port 48 for supplying nitrogen through a check valve 32B to HPPV vent valve 34B and to HPPV purge valve 34A before passing through check valve 32A for subsequent communication with gas module 12C and so on.

According to the present invention, a driver gas for operating the pneumatic valves is supplied at 46 where the driver gas has a different atomic mass unit than an ion generated from the gaseous source material supplied at 44.

For example, in the case that the gaseous source material is, for example, $SiF_4$ supplied to create a silicon ion (AMU= 28) by creating a plasma in ion source chamber 22, the driver gas is desirably an inert gas other than nitrogen ($N_2$ AMU= 28). As previous explained in the background, analyzer magnets downstream (not shown) of the ion source chamber 22 are incapable of differently affecting the flight paths of these ions, thereby allowing both ions to pass through to impact the target material. Since the driver gas may leak through the pneumatic valves to enter into the source material gas stream, a process that uses silicon ions in an ion implanter process requires an inert driver gas other than $N_2$ for proper operation. Suitable driver gases for use at gas source 46 are inert gases such as argon and helium. It will be appreciated by one skilled in the art that other noble gases may likewise be used although it may not economically feasible.

Figure 2:
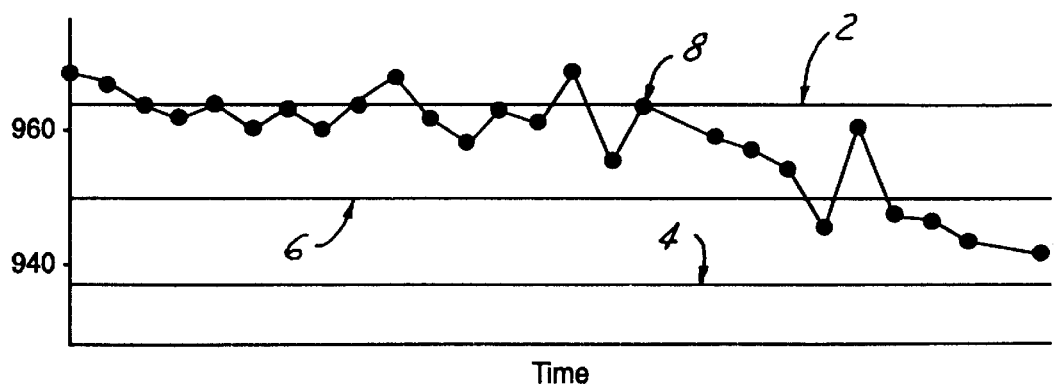
FIG. 2 is a graphical presentation of data representing a level of silicon implantation by an ion implanter.

As an example of the improved operation of an ion implanter FIG. 2 shows a series of data points that represent thermawave measurements taken over a period of several days. The horizontal axis represents time with the time between data points is about 12 hours. As previously explained in the background, the calibration of an ion implanter may be checked by implanting, for example, silicon ions for a fixed period of time. The damage induced by ion implantation in a target material is then measured by measuring relative changes in the reflectivity of the surface (i.e., a thermawave measurement).

Shown in FIG. 2, are the lines 2 and 4 which represent the upper and lower limits of allowable deviation from a previous calibration for silicon ion implantation represented by a mean value at line 6. As shown in the data, implantations up to the point shown at 8 show that many of the thermawave measurements indicated the ion implanter operation, was either at the upper limit of allowable deviation or "out of specification" (above line 2). The thermawave measurement results following the time indicated at 8 represent silicon ion implantations where the driver gas $N_2$, was replaced by Argon. It can be seen that the thermawave measurements, and consequently the ion implanter operation showed operation well within specification (between lines 2 and 4).

It is believed that the use of $N_2$ caused spurious results in the thermawave measurements indicating that the ion implanter was operating out of specification. The replacement of the driver gas with a different inert gas, for example, Argon, with a different atomic mass unit eliminated the spurious results, thereby avoiding implantation contamination and giving a more accurate measurement of silicon implantation.

It will be appreciated by those skilled in the art that more than one module may be plumbed in parallel to provide gaseous source materials as shown by the gas modules 12A, 12B, and 12C.

What is claimed is:

1. A gaseous supply system for supplying at least one gaseous source material to an ion source chamber for subsequent ion implantation comprising:

at least one gas supply module in gaseous communication with an ion source chamber comprising at least one pneumatic valve to control the delivery of at least one gaseous source material to the ion source chamber for generation of ions comprising silicon ions for implantation;

the at least one gas supply module provided in selective gaseous communication with the at least one gaseous source material for independent delivery to the join source chamber; and a driver gas source comprises at least one nitrogen-free inert gas in communication with the at least one pneumatic valve for operating the at least one pneumatic valve wherein the driver gas source has a different atomic mass unit than the silicon ions.

2. The gaseous supply system of claim 1, wherein the at least one nitrogen free inert gas comprises a gas selected from the group consisting of helium and argon.

3. The gaseous supply system of claim 1, wherein said at least one gaseous source material further comprises gaseous source material for generating ions selected from the group consisting of As, Ph, and B.

4. The gaseous supply system of claim 1, wherein the at least one gas supply module with the at least one pneumatic valve comprises a first valve in downstream communication with the at least one gaseous source material said first valve in upstream communication with a means for determining a flow rate and a second valve in downstream communication with the means for determining a flow rate for selecting gaseous downstream communication with an ion source chamber.

5. The gaseous supply system of claim 4, further comprising a bypass valve in upstream gaseous communication with said first valve and in gaseous downstream communication with said downstream ion source chamber to define a gaseous pathway bypassing said means for determining a flow rate and said second valve.

6. The gaseous supply system of claim 5, further comprising a plurality of gas supply modules in parallel gaseous communication with downstream ion source chamber.

7. The gaseous supply system of claim 4, wherein means for determining a flow rate of the at least one gaseous source material comprises a mass flow controller.

8. The gaseous supply system of claim 1, further comprising a purge line including at least one pneumatic valve in communication with said gas supply module wherein the purge line is fed with a gaseous purge source having a different atomic mass unit than the silicon ions.

9. A gaseous supply system for supplying at least one gaseous source material to an ion source chamber for subsequent ion implantation comprising:

at least one gas supply module in gaseous communication with an ion source chamber comprising at least one pneumatic valve to control the delivery of at least one gaseous source material to the ion source chamber for generation of ions comprising silicon ions for implantation, wherein the at least one gaseous source material comprises SiF;

the at least one gas supply module provided in selective gaseous communication with the at least one gaseous source material for independent delivery to the ion source chamber; and a driver gas source in communication with the at least one pneumatic valve for operating the at least one pneumatic valve wherein the driver gas source has a different atomic mass unit than the silicon ions.

10. The method of supplying at least one gaseous source material to an ion source chamber for subsequent ion implantation comprising the steps of:

providing at least one gas supply module in gaseous communication with an ion source chamber comprising at least one pneumatic valve to control the delivery of at least one gaseous source material to said ion source chamber for production of ions comprising silicon ions for implantation;

providing said at least one gaseous source material in communication with said at least one gas supply module for independent delivery of said at least one gaseous source material to said into source chamber;

providing a driver gas source comprises at least one nitrogen-free inert gas in communication with said at least one pneumatic valve for operating said at least one pneumatic valve said driver gas source having a different atomic mass unit than said silicon; and selectively operating said at least one pneumatic valve to controllably deliver said at least one gaseous source material to said ion source chamber.

11. The method of claim 10, wherein the at least one nitrogen free inert gas comprises a gas selected from the group consisting of helium and argon.

12. The method of claim 10, wherein said at least one gaseous source material further comprises gaseous source material for generating ions selected from the group consisting of As, Ph, and B.

13. The method of claim 10, wherein the at least one gas supply module with the at least one pneumatic valve comprises a first valve in downstream communication with the at least one gaseous source material said first valve in upstream communication with a means for determining a flow rate and a second valve in downstream communication with the means for determining a flow rate for selecting gaseous downstream communication with an ion source chamber.

14. The method of claim 10, further comprising a bypass valve in upstream gaseous communication with said first valve and in gaseous downstream communication with said downstream ion source chamber to define a gaseous pathway bypassing said means for determining a flow rate and said second valve.

15. The method of claim 14, further comprising a plurality of gas supply modules in parallel gaseous communication with a downstream ion source chamber.

16. The method of claim 13, wherein means for determining a flow rate of the at least one gaseous source material comprises a mass flow controller.

17. The method of claim 10, wherein the at least one gaseous source material comprises $SiF_4$.

18. The method of claim 10, further comprising supplying a purge line including at least one pneumatic valve in communication with said gas supply module wherein the purge line is fed with a gaseous purge source having a different atomic mass unit than the silicon ions.

* * * * *